United States Patent
Hahn et al.

(10) Patent No.: US 9,978,872 B1
(45) Date of Patent: May 22, 2018

(54) NON-POLAR, III-NITRIDE SEMICONDUCTOR FIN FIELD-EFFECT TRANSISTOR

(71) Applicant: International Business Machines Corporation, Armonk, NY (US)

(72) Inventors: Utz Herwig Hahn, Adliswil (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/467,843

(22) Filed: Mar. 23, 2017

(51) Int. Cl.
| | |
|---|---|
| H01L 29/66 | (2006.01) |
| H01L 29/78 | (2006.01) |
| H01L 29/20 | (2006.01) |
| H01L 29/04 | (2006.01) |
| H01L 29/06 | (2006.01) |
| H01L 29/205 | (2006.01) |

(Continued)

(52) U.S. Cl.
CPC ........ *H01L 29/785* (2013.01); *H01L 21/0254* (2013.01); *H01L 21/02381* (2013.01); *H01L 21/02433* (2013.01); *H01L 21/8252* (2013.01); *H01L 21/823431* (2013.01); *H01L 21/845* (2013.01); *H01L 23/3171* (2013.01); *H01L 27/1211* (2013.01); *H01L 29/045* (2013.01); *H01L 29/0649* (2013.01); *H01L 29/2003* (2013.01); *H01L 29/205* (2013.01); *H01L 29/66431* (2013.01); *H01L 29/66462* (2013.01); *H01L 29/66522* (2013.01); *H01L 29/66795* (2013.01); *H01L 29/7787* (2013.01); *H01L 29/7851* (2013.01); *H01L 29/7856* (2013.01)

(58) Field of Classification Search
None
See application file for complete search history.

(56) References Cited

U.S. PATENT DOCUMENTS

| | | | |
|---|---|---|---|
| 8,927,371 B2 | 1/2015 | Ko et al. | |
| 9,076,813 B1 * | 7/2015 | Lee | ............... H01L 29/78696 |

(Continued)

FOREIGN PATENT DOCUMENTS

| | | |
|---|---|---|
| CN | 105280696 A | 1/2016 |
| KR | 101595780 B1 | 8/2014 |

OTHER PUBLICATIONS

Ture et al., "High-Current Submicrometer Tri-Gate GaN High-Electron Mobility Transistors With Binary and Duaternary Barriers," Journal of the Electron Devices Society, vol. 4, No. 1, pp. 1-6, Jan. 2016.

(Continued)

*Primary Examiner* — Minh-Loan Tran
(74) *Attorney, Agent, or Firm* — Daniel P. Morris, Esq.; Otterstedt, Ellenbogen & Kammer, LLP

(57) ABSTRACT

A non-polar, III-Nitride semiconductor fin field-effect transistor (hereafter "finFET") includes both a fin and a Si(110) silicon substrate, the silicon substrate having a support surface parallel to a Si(110) plane of the silicon substrate. The fin includes a III-Nitride crystalline layer grown along its c-direction, so as to have sidewalls that are parallel to m and a planes of the III-Nitride crystalline layer. The c-direction is parallel to a Si<111> direction of the silicon substrate, such that two opposite ones of said sidewalls are parallel to the support surface of the silicon substrate. Related devices and methods of fabrication are also provided.

25 Claims, 6 Drawing Sheets

(51) Int. Cl.
    *H01L 29/778*     (2006.01)
    *H01L 23/31*     (2006.01)
    *H01L 27/12*     (2006.01)
    *H01L 21/02*     (2006.01)
    *H01L 21/84*     (2006.01)
    *H01L 21/8252*     (2006.01)
    *H01L 21/8234*     (2006.01)

(56) References Cited

U.S. PATENT DOCUMENTS

| | | | |
|---|---|---|---|
| 9,171,954 B2 | 10/2015 | Cartier et al. | |
| 9,202,920 B1 | 12/2015 | Liu et al. | |
| 9,806,203 B2* | 10/2017 | Then | H01L 29/78696 |
| 2013/0285129 A1* | 10/2013 | Jensen | H01L 21/268 |
| | | | 257/288 |
| 2014/0264369 A1* | 9/2014 | Padmanabhan | H01L 29/7787 |
| | | | 257/76 |

OTHER PUBLICATIONS

Chandan Yadav et al., "Modeling of GaN-BAased Normally-off FinFET," IEEE Electron Device Letters 35(6), pp. 512-614, Jun. 2014.

\* cited by examiner

NON-POLAR, III-NITRIDE SEMICONDUCTOR FIN FIELD-EFFECT TRANSISTOR

BACKGROUND

The invention relates in general to the field of fin field-effect transistors, also called finFET in the art. In particular, it relates to a finFET, whose fin is grown so as for the finFET to be essentially non-polar. The invention is further directed to integrated circuits, comprising such a non-polar finFET and related methods of fabrication.

The term finFET (fin field-effect transistor) was initially introduced to describe a non-planar, double-gate transistor on an SOI substrate, wherein the conducting channel is wrapped by an insulator and a gate electrode. The wrap-around gate structure accordingly obtained was shown to provide improved electrical control over the channel, which notably helps in reducing the leakage current. More generally, the term finFET is today used in the literature to describe any fin or nanowire based, multigate transistor architecture (irrespective of the number of gates).

While finFETs have shown to provide suitable gate control for short channel FETs in silicon (Si), Gallium nitride (GaN) has shown to be a material of choice both for radio frequency (RF) power amplification and power switching. In addition, GaN can also be utilized for high-speed digital logic. In terms of digital logic, the large bandgap of GaN yields a higher on/off ratio and hence makes it possible to fabricate low power circuits or to further downscale the power supply voltage ($V_{dd}$).

A GaN finFET would, a priori, have all the necessary properties to push the limits of finFET devices in terms of current density at RF level (direct current) at extremely scaled footprints. However, GaN finFETs have so far either been fabricated as: (i) metal-oxide-semiconductor field-effect transistors (MOSFETs) or (ii) as mixed polar/non-polar structures. In the former case, the electron mobility is considerably lower than for heterostructures. For mixed polar/non-polar structures, however, it can be realized that the device physics prevent a proper turn-off/turn-on behavior, owing to the different behaviors of the polar region and the non-polar region of the device.

SUMMARY

According to a first aspect, the present invention is embodied as a non-polar, III-Nitride semiconductor fin field-effect transistor. This transistor (hereafter "finFET") comprises both a fin and a Si(110) silicon substrate. The silicon (Si) substrate has a support surface parallel to a Si(110) plane of the Si substrate. The fin comprises a III-Nitride (or III-N) crystalline layer grown along its c-direction, so as to have sidewalls that are parallel to m and a planes of the III-Nitride crystalline layer. The c-direction is parallel to a Si<111> direction of the Si substrate, such that two opposite ones of said sidewalls are parallel to the support surface of the Si substrate.

It can be appreciated that the geometry adopted here for the fin, its growth, and the Si substrate results in an essentially non-polar device. This, in turn, allows improved turn-off/turn-on behaviors to be achieved. For instance, as a result of the wide bandgap of the III-Nitride crystalline layer, the on/off ratio in scaled wide bandgaps can easily reach values larger than $10^8$. In addition, a homogeneous threshold voltage ($V_t$) can be obtained over all sections of the device and $V_t$ can further be adjusted to achieve either high- or low-power devices.

In embodiments, the Si substrate has a step profile, this including a lower step and an upper step. The support surface of the Si(110) silicon substrate plays the role of a tread of the lower step, which is separated from the upper step by a riser. The riser is parallel to Si(111) planes of the Si substrate. The III-Nitride crystalline layer is in contact with and extends from the riser. This step profile can advantageously be used in preferred fabrication methods that are discussed later in detail.

The finFET typically comprises a dielectric layer between the III-Nitride crystalline layer and the tread, which dielectric layer may for instance comprises $SiO_2$.

This dielectric layer may for instance form part of a template used to fabricate the device. That is, in preferred embodiments, the finFET further comprises a template material, which includes said dielectric layer. The template material defines, at least partly, an aperture to the riser of the Si substrate and the III-Nitride crystalline layer extends from the riser, through the aperture. Owing to the adopted geometry, the aperture extends perpendicular to the Si<111> direction of the substrate, so as to allow access to an inner surface portion of the riser. Thus, the above aperture can be regarded as a through hole, allowing access to an inner surface portion on the riser, so as to make it possible to grow the III-N material from this surface portion.

In embodiments, said dielectric layer is a first dielectric layer and the template material comprises a second dielectric layer, extending at least partly parallel to the first dielectric layer. The III-Nitride crystalline layer is sandwiched between the first and the second dielectric layers. The aperture is defined, at least partly, by the first dielectric layer and the second dielectric layer. Preferably then, the dielectric layers have, each, a step profile, so as for them to successively extend parallel to said tread, thereby defining said aperture, then parallel to said riser and then parallel again to the tread. As such, the dielectric layers serve as a structured template material, which defines a selective epitaxy mask with an oriented channel and a trapping mechanism. As explained later in detail, the step structure of the dielectric layers can be used to filter out defects, while still making it possible to suitably grow the III-N material from the riser.

In preferred embodiments, the III-Nitride crystalline layer of the present devices comprises GaN, which is a suitable material for applications in RF power amplification, power switching, or high-speed digital logic. In particular, for digital logic, the large bandgap of GaN yields a high on/off ratio and hence makes it possible to fabricate low power circuits or to further downscale the power supply voltage, as noted earlier. In variants, other III-Nitride materials may be used, such as AlN or InN semiconductor materials or their compounds (e.g., any kind of $Al_xIn_yGa_{1-x-y}N$).

Preferably, embodiments of the present finFET devices further comprise: a barrier material partly wrapping the III-Nitride crystalline layer; and a gate, the latter partly wrapping the barrier material. In addition, this barrier material has a wider bandgap than a bandgap of the III-Nitride crystalline layer and a conduction band offset with respect to a conduction band of the III-Nitride crystalline layer, to prevent (or at least mitigate) gate leakage. For instance, this barrier material may comprise one or each of an oxide and $Al_xIn_yGa_{1-x-y}N$.

Preferably, the present finFET devices further comprise a source contact and a drain contact, each partly wrapping the III-Nitride crystalline layer on each side of the gate. More preferably, each of the source contact and the drain contact has a bilayer structure, wherein an inner layer of the bilayer structure comprises a doped III-Nitride material. The doped III-Nitride material used in the inner layer of that bilayer structure may for example have a thickness that is substantially equal to the thickness of the barrier material or, at least, typically on the same order of magnitude. The barrier material will for example extend so as to meet the doped III-Nitride material of the bilayer structure of each of the source contact and the drain contact at an interface therewith. For example, the III-Nitride crystalline layer may comprise GaN and the doped III-Nitride material of the inner layer of the bilayer structure of each of the source contact and the drain contact may comprise doped GaN.

In embodiments, the present finFET devices further comprise a passivation layer covering, entirely, the barrier material, in order to reduce the amount of surface traps for the III-N material of the fin.

According to another aspect, the invention is embodied as an integrated circuit, comprising a non-polar, III-Nitride finFET such as described above. This integrated circuit may advantageously be used in various applications, e.g., in RF power amplification, power switching, or high-speed digital logic, as noted above.

According to still another aspect, the invention may be embodied as a method of fabrication of a non-polar, III-Nitride finFET such as described above. Essentially, this method relies on: providing a Si(110) silicon substrate, which exhibits a support surface parallel to a Si(110) plane of the Si substrate; and growing a III-Nitride crystalline layer along its c-direction, so as for it to have sidewalls that are parallel to m and a planes of the III-Nitride crystalline layer, to obtain a fin for the finFET. Consistently with the geometry of the desired device, said c-direction is parallel to a Si<111> direction of the Si substrate, such that two opposite ones of said sidewalls are parallel to the support surface of the Si substrate, i.e., to obtain the desired fin.

Preferably, the Si substrate provided has a step profile, including a lower step and an upper step, wherein said support surface plays the role of a tread of the lower step, the latter separated from the upper step by a riser that is parallel to a Si(111) plane of the Si substrate. In addition, the III-Nitride crystalline layer is grown so as to be in contact with and extend from the riser.

In embodiments, the Si substrate is provided with a dielectric layer and the III-Nitride crystalline layer is grown above the dielectric layer, so as for the dielectric layer to be arranged between the III-Nitride crystalline layer and the tread.

Preferably, the Si substrate is provided with a template material, the latter including said dielectric layer, wherein the template material defines, at least partly, an aperture to the riser of the Si substrate, and wherein the III-Nitride crystalline layer is subsequently grown so as to extend from the riser, through the aperture.

In preferred embodiments, the method further comprises, prior to providing the Si substrate with the template material, obtaining said template material on the Si substrate.

Preferably, said dielectric layer is a first dielectric layer and the template material provided comprises a second dielectric layer, extending at least partly parallel to the first dielectric layer. In addition, the III-Nitride crystalline layer is grown between the first and the second dielectric layers.

In embodiments, the present methods of fabrication further comprise: depositing a barrier material so as for it to partly wrap the grown III-Nitride crystalline layer; and depositing and patterning a gate, the latter partly wrapping the barrier material. For reasons given earlier, the barrier material has a wider bandgap than a bandgap of the III-Nitride crystalline layer grown and a conduction band offset with respect to a conduction band of the III-Nitride crystalline layer.

Preferably, the III-Nitride crystalline layer grown comprises GaN and the barrier material deposited comprises a material selected from: $Al_xIn_yGa_{1-x-y}N$; and an oxide.

In preferred embodiments, the present methods of fabrication further comprise depositing and patterning a source contact and a drain contact, so as for each of the source contact and the drain contact to partly wrap the III-Nitride crystalline layer on each side of the gate patterned.

Preferably, each of the source contact and the drain contact are deposited as a bilayer structure, wherein an inner layer of the bilayer structure comprises a doped III-Nitride material.

Devices and fabrication methods embodying the present invention will now be described, by way of non-limiting examples, and in reference to the accompanying drawings.

Figure 1A:
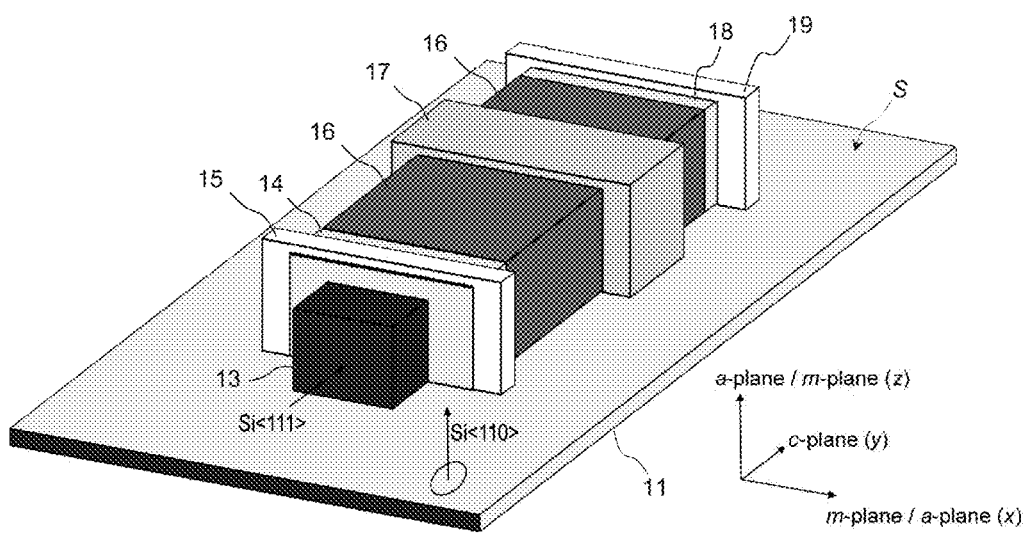
FIG. 1A is a 3D view of a non-polar, III-Nitride semiconductor finFET, according to embodiments.

The accompanying drawings show simplified representations of devices or parts thereof, as involved in embodiments. Some components of the device may not be depicted, for the sake of depiction. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

In reference to FIGS. 1-4, a general aspect of the invention is first described, which concerns a non-polar, III-Nitride semiconductor fin field-effect transistor 10, 20, 30 (hereafter to a "finFET"). Here, the term finFET denotes a fin-based transistor architecture, which may be a multigate transistor.

Three classes of embodiments of such a finFET are depicted in the appended drawings. In FIGS. 2G-H and 3G-H, the finFET devices are, each, built on a silicon (Si) substrate that exhibits a riser 212, 312, whereas in FIG. 1, the depicted device 10 does not show such a riser. Furthermore, in FIGS. 3G-H, the finFET device 30 has a fin grown so as to have a step profile, as opposed to FIGS. 1 and 2.

In each of these embodiments, the device 10, 20, 30 comprises a Si(110) silicon substrate 11, 21, 31. I.e., the Si substrate exhibits a support surface S that parallel to a Si(110) plane of the substrate. The present devices 10, 20, 30 further comprise a fin 13, 23, 33. The length of the fin, as measured along the Si<111> direction, e.g., from the drain 15, 25, 35 to the source 19, 29, 39, determines the effective channel length of the device.

The fin comprises a III-Nitride crystalline layer 13, 23, 33. III-Nitride semiconductors are compounds such as AlN, GaN and InN semiconductor materials, which compounds have direct energy-band gaps. Their properties include stability at high temperatures and good thermal conductivities, which make them suitable for the fabrication of transistors. Here, the III-Nitride crystalline layer 13, 23, 33 is grown along its c-direction. As a result, the fin exhibits sidewalls that are parallel tom and a planes of the III-Nitride crystalline layer 13, 23, 33. Them and a planes of the III-Nitride crystalline layer are defined by directions [−1100] and [11-20], respectively, of the crystalline layer 13, 23, 33.

In addition, the c-direction of the layer 13, 23, 33 is, in each case, parallel to the Si<111> direction of the Si substrate. With such a geometry, two opposite sidewalls 231, 232; 331, 332 (e.g., the top and bottom faces, which may, each, be parallel either to m planes or a planes of the crystalline layer 13, 23, 33) of the fin turns out to be parallel to the support surface S of the Si substrate. That is, if one of the planes 231, 232 (say, e.g., plane 231) is parallel to an m-plane, then the other plane (plane 232) is necessarily parallel to an m-plane too. In that case, each of the other two lateral planes (see, e.g., FIG. 2D), which extends transversely to the substrate, will be parallel to an a-plane of the layer 13, 23, 33.

The above device is, by construction, non-polar, i.e., there is no substantial polarization at any of the exposed facets of the device, as per the geometry of the layers as enabled by the present approach. There is no substantial polarization either at any of the interfaces of the device and, in particular, no substantial polarization at any interface between the III-N fin and the surrounding materials. Yet, we note that the device may exhibit some polarization between the Si(111) plane and the c-plane of the III-N material, i.e., where the growth of the III-N material is started, in particular in embodiments involving risers as discussed below. However, such a polarization does not influence the operation of the device and its behavior, such that a skilled person would consider that the resulting finFET device is essentially non-polar. The present devices are hereafter referred to as "non-polar" devices, for simplicity.

Note that by "non-polar", it is meant an essentially or strictly non-polar-only device, which need be distinguished from a mixed polar/non-polar device, as known in the art. A mixed polar/non-polar device is a device exhibiting polarized interfaces that substantially impact its behavior, as the skilled person knows, whereas to sole, residual polarization effects that may be involved in embodiments of the present devices do not occur at key interfaces of the devices (all exposed facets are non-polar only) and do not impact its turn-on/turn-off behavior, as the skilled person will appreciate.

In the present embodiments, the geometry of the fin and the Si substrate results in non-polar devices, which, in turn, allow improved turn-off/turn-on behaviors to be achieved. For instance, as a result of the wide bandgap of the III-Nitride crystalline layer, the on/off ratio in scaled wide bandgaps can easily reach values larger than $10^8$ (whereas this ratio may exceed $10^{12}$ in unscaled devices). In addition, a homogeneous threshold voltage ($V_t$) can be obtained over all sections of the device and $V_t$ can further be adjusted to achieve either high- or low-power devices. This is particularly advantageous for low power devices, because the power supply voltage $V_{dd}$ can be reduced to obtain an on/off behavior comparable to or even better than that obtained with low bandgap materials.

On the contrary, prior art structures that have mixed polar/non-polar interfaces lead to different intrinsic behaviors. Even when no barrier is used in such devices, the polarity happens to change the device behavior (e.g., due to trapping phenomena). In addition, the mobility at the oxide/III-Nitride interface may be lower than at heterointerfaces of such devices. Such drawbacks can be circumvented by using a non-polar-only device, as disclosed in embodiments herein.

To summarize, embodiments of the present devices allow only non-polar facets to be exposed, which, in turn, allows steep turn-on/off behaviors. In addition, embodiments as described below allow a homogeneous $V_t$ to be obtained over all device sections. All such advantages, as well as others described below, are enabled thanks to the primary design of the present finFET devices, i.e., which relies on a fin core comprising a III-Nitride material grown along its c-direction, parallel to the Si<111> direction of the Si substrate and thus parallel to the support surface S which is parallel to Si(110) planes of the Si substrate.

The III-Nitride crystalline layer 13, 23, 33 preferably comprises GaN, for reasons mentioned earlier. In variants, other III-Nitride materials may be used, such as AlN or InN semiconductor materials or their compounds i.e., any kind of $Al_xIn_yGa_{1-x-y}N$.

As illustrated in FIGS. 1-3, the present finFET devices 10, 20, 30 preferably comprise a barrier material 16, 26, 36, which is structured so as to partly wrap the III-Nitride crystalline layer 13, 23, 33. The depicted devices 10, 20, 30 also comprise a gate 17, 27, 37, which partly wraps the barrier material 16, 26, 36. The gate typically wraps a middle portion of the barrier, as assumed in the appended drawings. However, the gate may, in variants, wrap the entire section of the barrier (as in gate-all-around FETs, to ensure identical passivation on all interfaces). Still, no gate material is needed underneath the barrier (e.g., between the dielectric layer 221 and the lower end of the barrier 26 in FIG. 2G), so that the gate only partly wraps the barrier in all cases. We keep in mind that each of the barrier 16, 26, 36 and the contacts 14, 24, 34, 17, 27, 37, 18, 28, 38 typically have a "∩" structure, so as to cap a structure directly underneath.

Preferably, the barrier material 16, 26, 36 has a wider bandgap than the bandgap of the III-Nitride crystalline layer and its conduction band is offset with respect to the conduction band of the III-Nitride crystalline layer, in order to prevent (or at least mitigate) gate leakage.

For instance, this barrier material 16, 26, 36 comprises an oxide and/or $Al_xIn_yGa_{1-x-y}N$. The oxide may be an amorphous or a crystalline oxide, provided the above conditions (in terms of bandgaps and conduction bands) are satisfied. In variants, $Al_xIn_yGa_{1-x-y}N$ can be used. $Al_xIn_yGa_{1-x-y}N$ may for instance be δ-doped to favor the formation of a 2D electron gas. In other variants, the barrier material 16, 26, 36 may comprise both a layer of AlGaN and a layer of oxide to reduce gate leakage for thin barrier/oxide thicknesses while maintaining good channel control for scaled device dimensions.

In embodiments as depicted in FIGS. 1-3, the finFETs 10, 20, 30 further comprise a source contact 18, 19; 28, 29; 38, 39 and a drain contact 14, 15; 24, 25; 34, 35. Each of the source contact and the drain contact partly wraps the III-Nitride crystalline layer 13, 23, 33, i.e., on each side of the gate 17, 27, 37.

Different device configuration can be contemplated. For example, the present finFET devices may, in embodiments (not shown), be designed as HFET-like devices (e.g., using AlGaN alone or in combination with an oxide for the barrier). This can be achieved thanks to an intentional spacings $L_{gs}$ and $L_{gd}$, respectively ensured between the gate and the source and between the gate and the drain (for which, typically, $L_{gd} > L_{gs}$). In that case, the breakdown voltage $V_{bd}$ is typically limited by the III-N material fin portion extending between the gate and the drain. Higher breakdown voltages can thus be achieved but this would typically come at the price of increasing the resistance of the device in its ON-state.

In variants, the present finFET devices may also be designed as MOSFET-like devices (e.g., using AlGaN and/or an oxide, for the barrier, not shown). This can be realized thanks to an overlap between the doped III-N regions (in the source/drain contact regions) and the gate. To mitigate gate leakage currents, additional portions of oxide materials would extend, on the one hand, between the source and the gate and, on the other hand, between the gate and the drain. The breakdown voltage $V_{bd}$ would then be limited by the additional portions of oxide materials. MOSFET-like configurations will more likely lead to a lower resistance (in ON-state) at the cost of a lower breakdown voltage.

As further assumed in FIGS. 1-3, each of the source contact 18, 19; 28, 29; 38, 39 and the drain contact 14, 15; 24, 25; 34, 35 preferably has a bilayer structure, where the upper layer (see e.g., layer portion 25 or 29 in FIG. 2G) at least partly covers an inner layer (e.g., layer portion 24 or 28). In particular, the inner layer 14, 24, 34; 18, 28, 38 of that bilayer structure may comprise a doped III-Nitride material, in order to reduce the parasitic contact resistance, which, in turn, allows to the devices' resistance in ON-state to be lowered.

The doped material used for the inner layer shall preferably have a thickness that is substantially equal to the thickness of the barrier material (the thicknesses measured perpendicularly to two opposite sidewalls of the III-nitride material, i.e., parallel to either m-planes or a-planes thereof). This, however, is not strictly needed, i.e., the doped III-Nitride material can also be thinner or (more likely) thicker than the barrier material. Still, such thicknesses will typically be on the same order of magnitude. The barrier material 16, 26, 36 will typically extend so as to meet the inner layer, i.e., the doped III-Nitride material of the bilayer structure of each of the source contact and the drain contact, at an interface therewith.

For example, while the III-Nitride crystalline layer 13, 23, 33 may for instance comprise GaN, doped GaN can be used for the inner layer 14, 24, 34; 18, 28, 38 of the bilayer structure of each of the source contact 18, 19; 28, 29; 38, 39 and the drain contact 14, 15; 24, 25; 34, 35.

In addition, the present finFET devices 10, 20, 30 may, in embodiments, further comprise a passivation layer 26a, 36a covering the barrier material 16, 26, 36 entirely. As such, this passivation layer advantageously reduces the amount of surface traps for the III-N material of the fin. Suitable passivation layers may for instance comprise an amorphous or a crystalline layer, such as $SiO_2$, SiN, $Al_2O_3$, diamond, etc.

Referring now to FIGS. 2G-2H and 3G-3H, in embodiments, the present finFETs 20, 30 may be built on a Si substrate 21, 31 that has a step profile. That is, the Si substrate exhibits a lower step 211, 311 and an upper step 212, 312. As depicted in FIGS. 2-3, the support surface S of the substrate corresponds to the tread of the lower step 211, 311, i.e., the support surface S is the top surface of the lower step. The lower step is separated from the tread on the upper step 212, 312 by a riser. The inner surface of this riser is parallel to the Si(111) plane of the Si substrate. This way, the III-Nitride crystalline layer 23, 33 may be grown so as to be in contact with and extend from the inner surface of the riser.

Figure 1B:
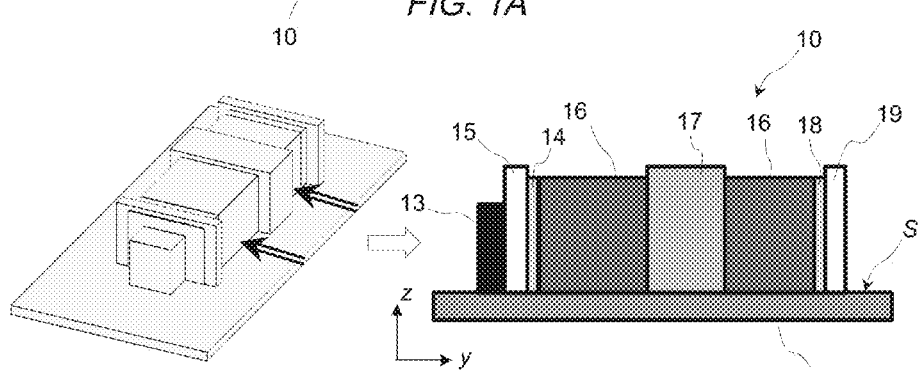
FIG. 1B is a side view of the device shown in FIG. 1A.
Figure 1C:
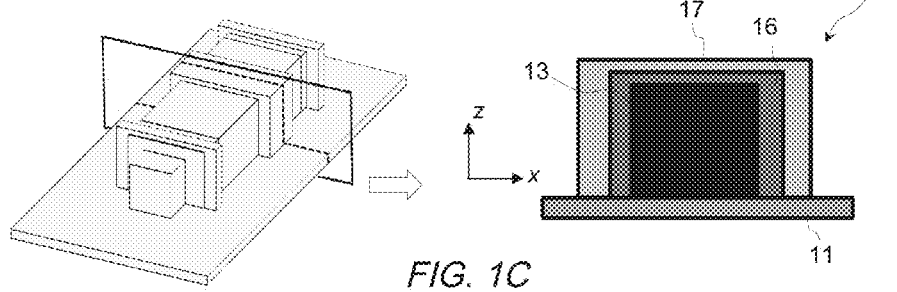
FIG. 1C is a 2D cross-sectional view of that same device, across the cutting plane as depicted in the left-hand side.

This particular aspect of the device corresponds to an advantageous fabrication method, which is discussed later in detail. Still, we note that the riser is not needed in the final product and may therefore be partly (or even completely) removed during the fabrication, if necessary (e.g., for improved device isolation). The final device may accordingly look like a device as depicted in FIGS. 1A-1C (where no riser is visible on the Si substrate).

In embodiments as depicted in FIGS. 2-3, the finFET 20, 30 further comprises a dielectric layer 221, 321, which is arranged between the III-Nitride crystalline layer 23, 33 and the tread of the lower step of the Si substrate, so as to insulate the III-Nitride crystalline layer. The dielectric layer 221, 321 may advantageously form part of a template used to fabricate the device, as discussed below. The dielectric layer 221, 321 preferably comprises $SiO_2$. For example, a lower sidewall of the III-Nitride crystalline layer may be in contact with the upper surface of the $SiO_2$ layer, whereas a lower surface of this $SiO_2$ layer is in contact with the tread support surface S of the lower step 211, 311 of the Si substrate.

As evoked just above, the finFET 20, 30 may comprise a template material (including said dielectric layer 221, 321), wherein the template material defines, at least partly, an aperture 225, 325 to the riser 212, 312 of the Si substrate 21, 31, so as to allow access to the inner surface portion of the riser, as seen in FIGS. 2A-B, 3A-B. Thus, and as illustrated in the subsequent figures, the III-Nitride crystalline layer 23, 33 can be grown so as to extend from the riser, through the aperture 225, 325 defined by the template material. As per the geometry of the devices 20, 30, the aperture 225, 325 extends in a plane perpendicular to the Si<111> direction of the substrate 21, 31, i.e., this plane is thus parallel to Si(111) planes of the riser.

If needed, the aperture may extend within the riser itself (i.e., lead to a cavity defined within the riser). In the embodiments of FIGS. 2B and 3B, the aperture 225, 325 is defined by two dielectric layers, together with the riser. The aperture can thus be regarded as a through hole, allowing access to the inner surface portion of the riser, the aperture allowing the III-N material to be grown from this inner surface portion.

In variants (not shown), the template material may have an aperture to the Si(110) surface (the normal to the aperture's plane would hence be parallel to the Si<110> direction of the substrate). In that case, the III-Nitride crystalline layer would first be grown vertically from the Si(110) basal surface of the substrate, through the aperture and there would be no need to use a profiled Si substrate in that case. However, such variants require additional control on the growth of the III-N material on the Si(110) substrate, in order to be able to achieve the desired sidewalls, i.e., parallel to a- and m-planes. Else, the III-Nitride material would likely grow with its c-planes perpendicular to the Si<110> direction, which would make the device a mixed polar/non-polar device. Still, this additional control lead to a III-N material of reduced quality, compared to a III-N material grown from Si(111) surfaces. Thus, best is to use a Si substrate having a step profile and grow the III-Nitride material from a raised portion (i.e., from a Si(111) surface of the riser, as assumed in FIGS. 2 and 3).

In embodiments such as depicted in FIGS. 2 and 3, the finFETs 20, 30 involve a template material that includes two dielectric layers, i.e., a first dielectric layer 221, 321 and a second dielectric layer 222, 322. The latter extends at least partly parallel to the first dielectric layer 221, 321, so as for the III-Nitride crystalline layer 23, 33 to be sandwiched between the first and the second dielectric layers. The aperture 225, 325 is nonetheless defined, at least partly, by the first dielectric layer and the second dielectric layer, at an end thereof.

Figure 3A:
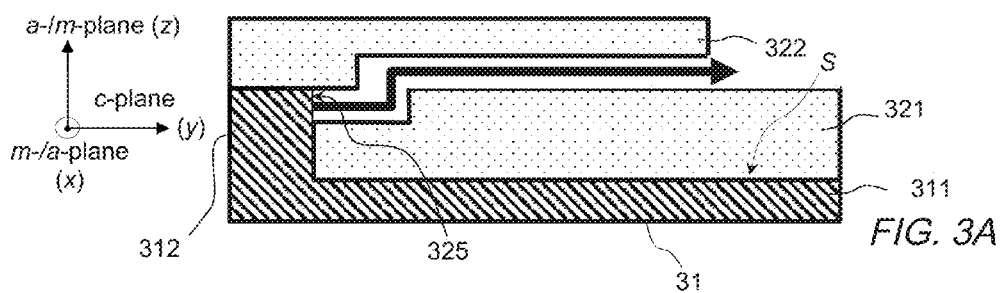
FIGS. 3A-3H illustrate a variant to the fabrication steps of FIGS. 2A-2H, to obtain a finFET device, whose fin has a step profile. As in FIGS. 2A-2H, two views are each time used to illustrate one fabrication step.
Figure 3B:
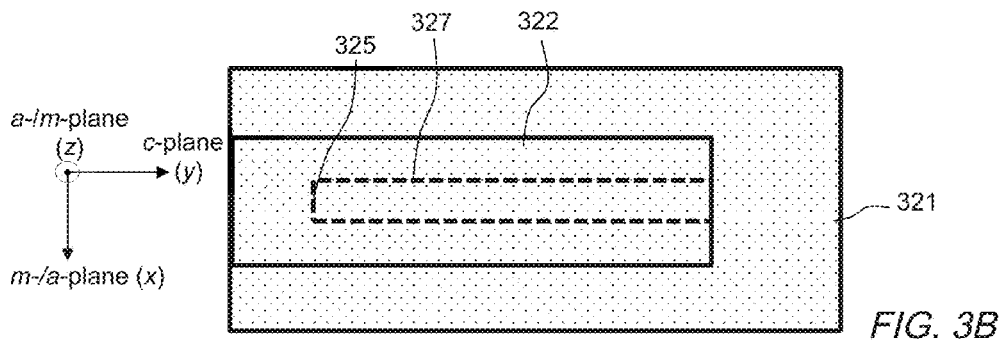
Figure 3C:
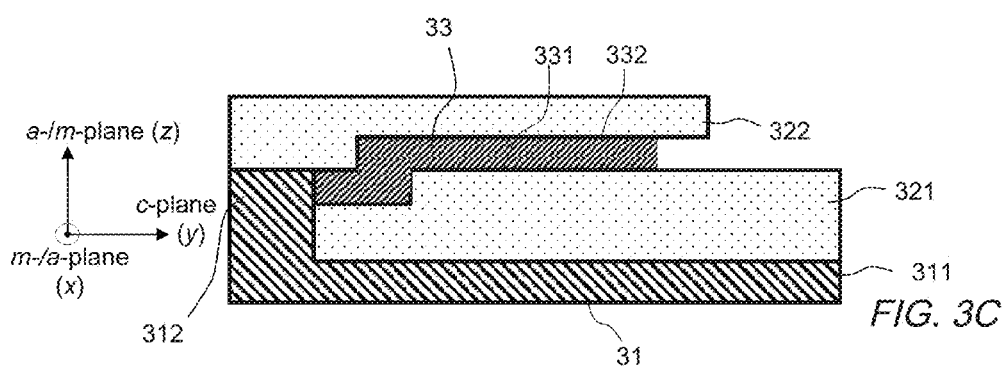
Figure 3D:
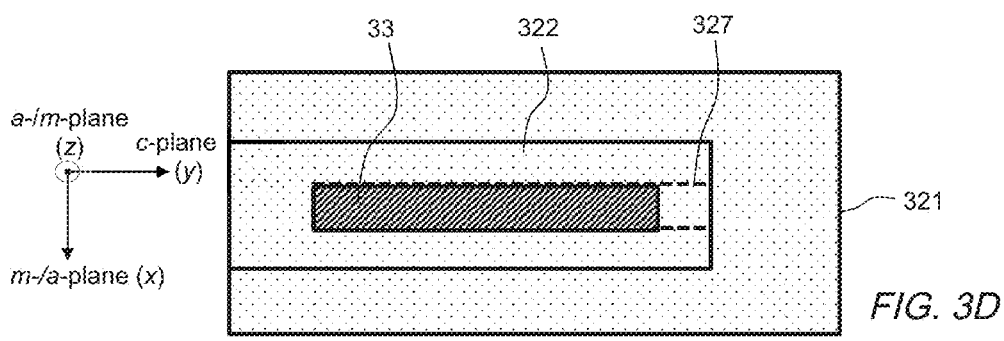
Figure 3E:
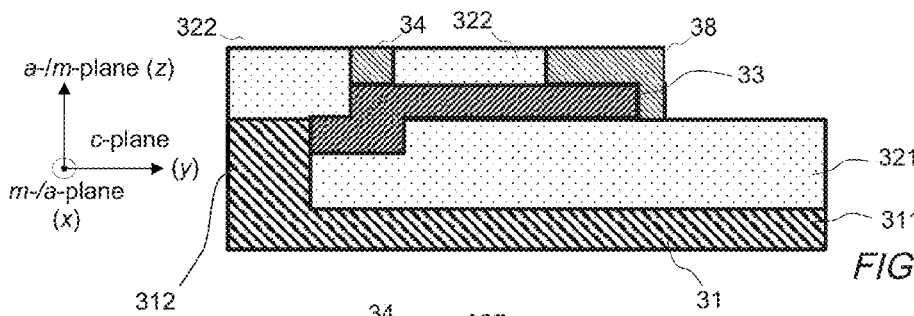
Figure 3F:
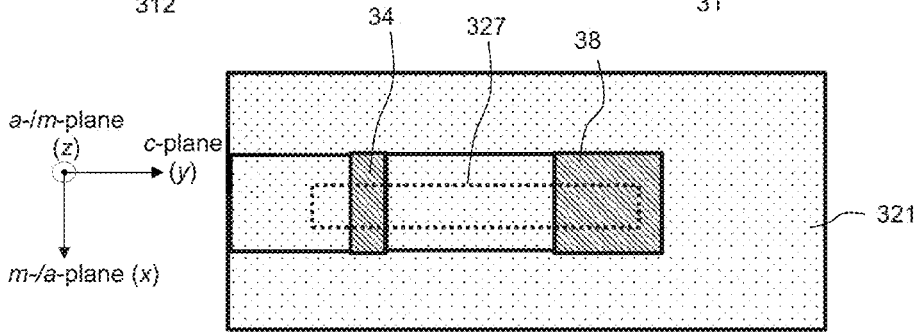
Figure 3G:
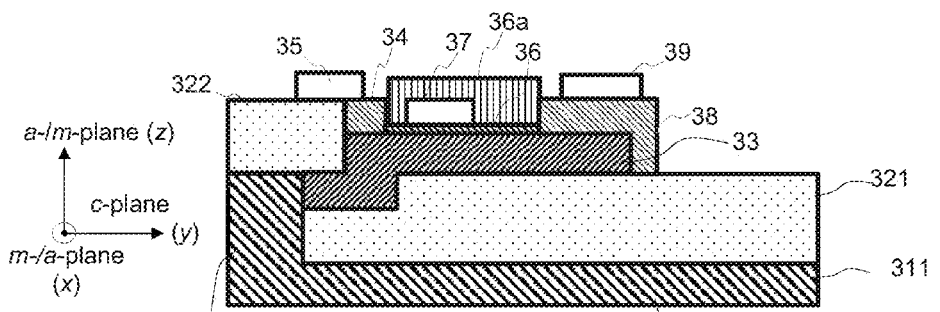
Figure 3H:
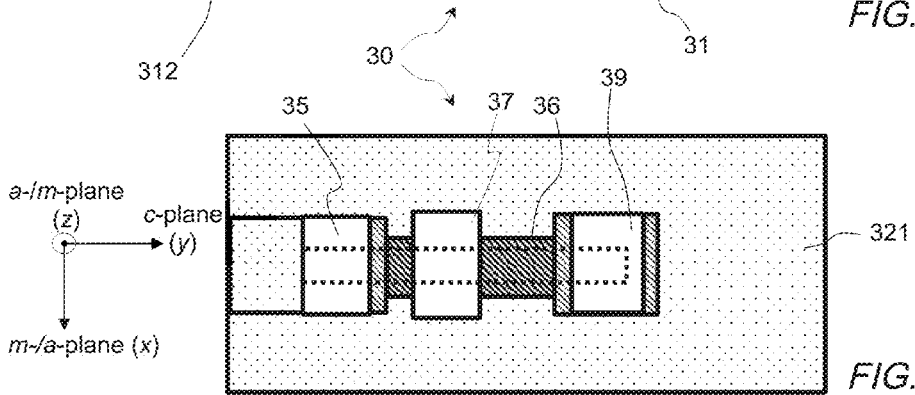
Figure 4:
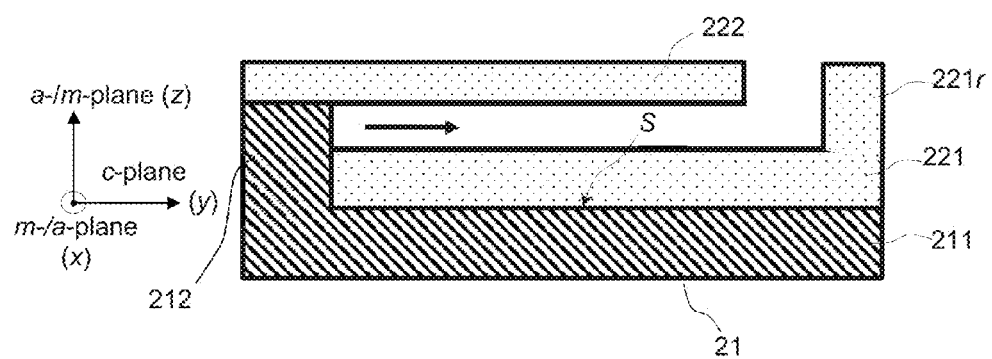
FIG. 4 illustrates a variant to FIG. 2A.

Note that in variants to FIGS. 2 and 3, the first dielectric layer 221 may include an additional riser on its right-hand side, as depicted in FIG. 4. This additional riser will naturally stop the growth of the III-N material, parallel to the support surface S of the Si substrate. Like the first one (on the left-hand side), this additional riser is, however, not needed in the final product and may therefore be removed during the fabrication process, if needed.

If necessary, the lower dielectric layer 221, 321 is patterned 227, 327 so as to laterally confine the growth of the fin layer 13, 23, 33.

In embodiments, the dielectric layers 221, 321; 222, 322 have, each, a step profile. That is, each of the dielectric layers successively extends:

First, parallel to the tread S of the lower step, thereby defining the needed aperture 225, 325;

Then, parallel to the riser 212, 312; and

Finally, parallel again to the tread S.

The stepped layers 321, 322 define a selective epitaxy mask, having a step profile so as to provide a trapping mechanism. As seen in FIG. 3C, this step defines a bend that gets filled with the III-Nitride crystalline layer, and causes to filter out crystal defects originating from the lattice mismatch between Si and the III-N material, in particular dislocations that elongate essentially along the c-direction and eventually lead to parasitic leakage current paths. That is, the III-Nitride crystalline layer is grown first along its c-axis, along the Si<111> direction (in a first section where defects likely elongate along the c-direction), then along the Si<110> direction (in a bent section, which causes to stop or mitigate the propagation of defects) and, finally, again along the c-axis. The second dielectric layer may comprise $SiO_2$ too.

Accordingly, the III-Nitride material eventually obtained has a step profile too, including a lower tread and a raised portion, each extending above and parallel to the Si substrate.

We note that, in variants, the III-Nitride crystalline layer may have a step profile, with the step being in-plane with the Si substrate instead of being raised. That is, the structured III-Nitride layer may be grown so as to have a flank parallel to the Si substrate. This can be achieved using a template (e.g., $SiO_2$) structure to grow the III-Nitride material that has transverse portions instead of portions that are merely parallel to the Si substrate (as assumed in FIG. 3). In that case, the III-Nitride material is grown first along its c-axis (along the Si<111> direction, from a riser), then in-plane with the Si substrate but perpendicularly to the Si<111> direction (i.e. the III-Nitride material is grown in m- or a-direction) and, finally, again along its c-axis.

Next, according to another aspect, the invention can be embodied as an integrated circuit, the latter comprising one or more finFET devices 10, 20, 30 as described herein. Such an integrated circuit may advantageously be used in various applications, e.g., in RF power amplification, power switching, or high-speed digital logic, as noted above. The invention may for instance be embodied as a microprocessor, comprising such an integrated circuit.

Referring now to FIGS. 2A-2H and 3A-3H, according to another aspect, the invention can be embodied as a method of fabrication of a non-polar, III-Nitride finFET 10, 20, 30 as described above. Essentially, such a method relies on a Si(110) silicon substrate 11, 21, 31, which exhibits a support surface S parallel to Si(110) planes of the Si substrate. Then, consistently with the present approach, a III-Nitride crystalline layer 13, 23, 33 is grown along its c-direction (parallel to the Si<111> direction of the Si substrate), and, this, in such a manner that the fin eventually exhibits sidewalls that are parallel to m and a planes of the III-Nitride crystalline layer. As a result, a fin 13, 23, 33 is obtained, which has two opposite sidewalls 231, 232; 331, 332 parallel to the support surface S of the Si substrate, to make up a non-polar device.

First, general aspects of embodiments of such a fabrication method are recalled (most of these have already been described or evoked earlier). To start with, and as explained earlier in reference to the devices 20, 30, the Si substrate 11, 21, 31 provided shall preferably have a step profile, see FIG. 2A or 3A. The Si substrate has a lower step 211, 311 and an upper step 212, 312, where the support surface S plays the role of a tread of the lower step 211, 311, the latter separated from the upper step 212, 312 by a riser. Then, the III-Nitride crystalline layer 13, 23, 33 is grown so as to be in contact with and extend from the riser. This allows to grow the III-Nitride crystalline layer from a Si(111) surface of the substrate, as illustrated in FIGS. 2A-2C and FIGS. 3A-3C.

Figure 2A:
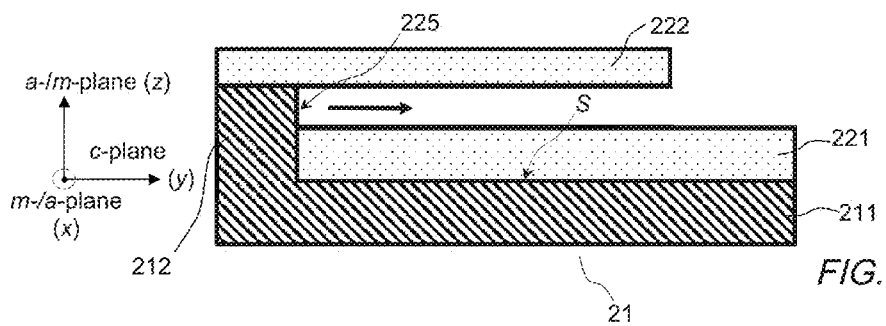
FIGS. 2A-2H illustrate high-level fabrication steps of a finFET device built on a structured Si substrate, according to embodiments. Two views of the device are systematically used to illustrate one fabrication step. The first view (e.g., FIG. 2A) is a longitudinal, 2D cross-sectional view, whereas the second view (e.g., FIG. 2B) is a top view of the device.
Figure 2B:
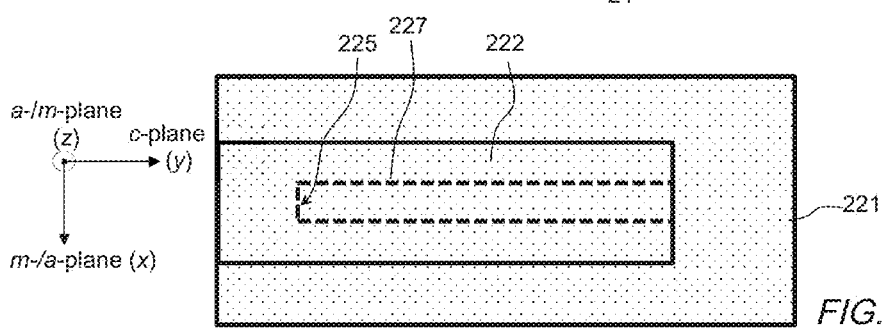
Figure 2C:
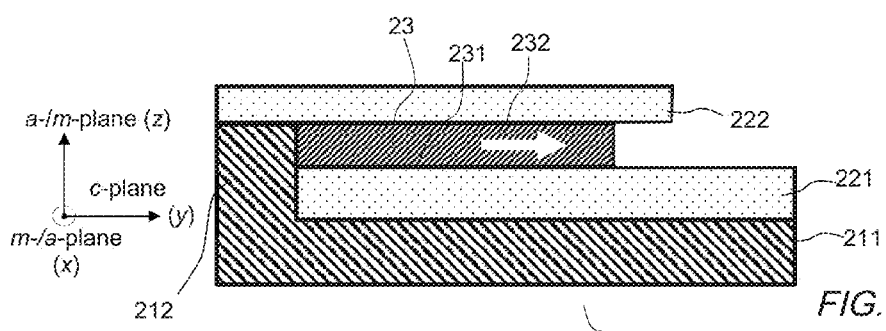
Figure 2D:
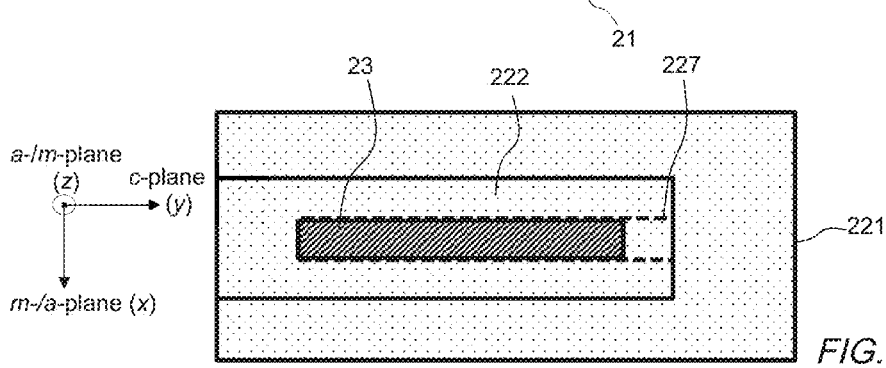

As also explained earlier, the Si substrate 11, 21, 31 is preferably provided with a dielectric layer 221, 321, see FIG. 2A or 3A, and the III-Nitride crystalline layer 13, 23, 33 is grown above this dielectric layer, so as for the latter to rest between the III-Nitride crystalline layer and the tread of the Si substrate and thereby insulate the fin 23, 33.

In fact, the Si substrate 11, 21, 31 is preferably provided with a template material that includes said dielectric layer 221, 321. The template material defines, at least partly, an aperture 225, 325 to the riser of the Si substrate. The III-Nitride crystalline layer 13, 23, 33 is subsequently grown so as to extend from the riser, through the aperture 225, 325.

Also, in embodiments, the method may further comprise prior steps of fabricating the template material on the Si substrate (not shown). For example, assuming $SiO_2$ is used as a basis material for this template, chemical vapor deposition may be used to obtain a $SiO_2$ layer, which is then patterned, e.g., by dry etching. Next, a-Si (or poly-Si) may be deposited (e.g., by CVD or sputtering) and patterned (e.g., by dry etching), so as to be used as a place holder for the III-N material to be deposited. The structure accordingly obtained may then be covered by a second $SiO_2$ layer, deposited on top, which second layer is finally opened to expose the place holder material. After this step, the a-Si/poly-silicon can be removed, via the opening performed in the second layer. Techniques similar to those described in patent application WO/2015/087230 may be used to obtain the template material. Accordingly, the template material may be fabricated so as to comprise two dielectric layers, extending at least partly parallel to each other, so as to allow the III-Nitride crystalline layer 13, 23, 33 to be grown between the two dielectric layers.

Incidentally, after the growth of the III-Nitride channel, the non-polar a-/m-sidewalls are typically slightly rounded, e.g., not perfectly planar in practice. This, however, can be alleviated by exposing the channel to a short overgrowth to smoothen and planarize the a-/m-sidewalls.

In embodiments, a barrier material 16, 26, 36 is deposited so as for it to partly wrap the previously grown III-Nitride crystalline layer 13, 23, 33. Then, the gate 17, 27, 37 is deposited and patterned, so as to partly wrap the barrier material, see FIGS. 2G, 3G. The barrier material is chosen so as to satisfy given electronic properties, as discussed earlier.

Next, a source contact 18, 19; 28, 29; 38, 39 and a drain contact 14, 15; 24, 25; 34, 35 may be deposited and patterned, so as for each of the contacts to partly wrap the III-Nitride crystalline layer 13, 23, 33 on each side of the gate 17, 27, 37 patterned (FIGS. 2E-G, 3E-G).

Figure 2E:
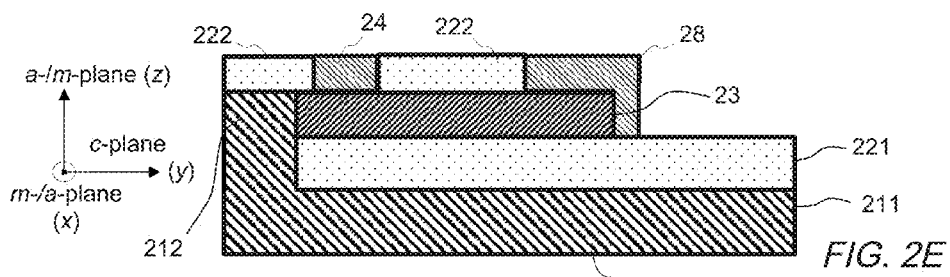
Figure 2F:
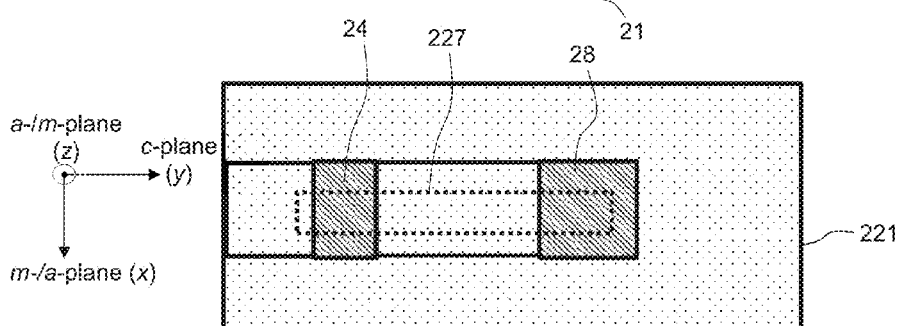
Figure 2G:
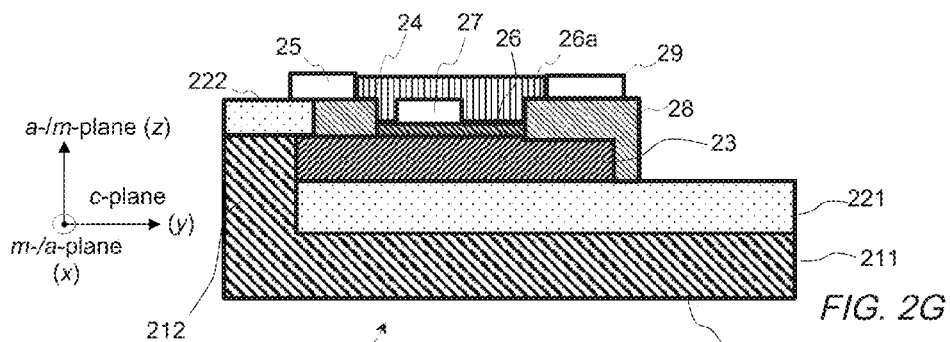
Figure 2H:
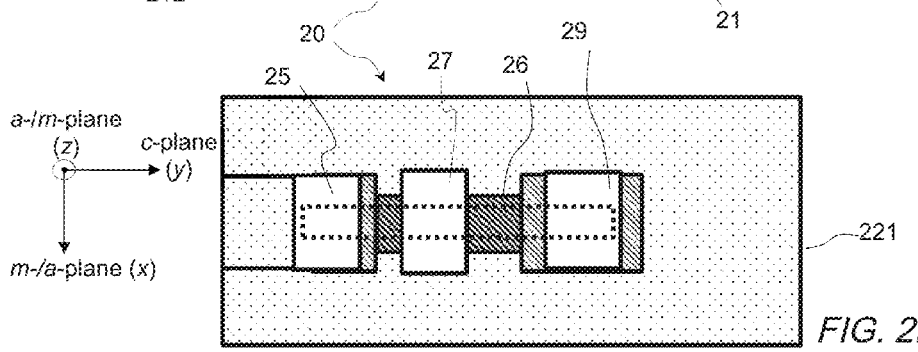

As further mentioned earlier, each of the source contact 18, 19; 28, 29; 38, 39 and the drain contact 14, 15; 24, 25; 34, 35 is preferably deposited as a bilayer structure (FIGS. 2E, 2G; 3E-3G). The inner layer 14, 24, 34; 18, 28, 38 of the bilayer structure comprises a doped III-Nitride material.

If necessary, a passivation layer 26a, 36a is deposited (FIGS. 2G, 3G, omitted in the top views of FIGS. 2H, 3H), which layer 26a, 36a covers the barrier material 16, 26, 36 entirely, so as to reduce the amount of surface traps for the III-N material of the fin. The passivation layer 26a, 36a can be brought on the device at any time after the barrier was brought in contact with the fin (i.e., after the growth of the barrier), for example, before the growth of the source and drain, or after the growth of the source and drain, or even after source/drain metal contacts are patterned, or still after the gate formation.

In the following, the sequences of FIGS. 2A-2H and 3A-3H are described step-by step:

FIGS. 2A-B, 3A-B: A Si substrate is provided, which has an L profile, whereon template layers 221, 222; 321, 322 have already been patterned, so as to define an aperture 225, 325 to the riser. A channel is preferably defined 227, 327 in the lower layer 221, 321, so as to laterally contain the subsequent growth of the fin, as depicted by dashed lines in FIGS. 2B, 3B. In FIG. 3A, a selective epitaxy mask is defined, to form a step-structured channel and obtain a trapping mechanism, as evoked earlier;

FIGS. 2C-D, 3C-D: the fin 23, 33 is grown from the riser 212, 312, along its c-axis;

FIGS. 2E-F, 3E-F: lower contacts of the drain 24 and source 28 (e.g., doped n$^{++}$) are defined and grown at given positions in the upper dielectric layer 222, 322. The drain contact is preferably offset with respect to the riser; and FIGS. 2G-H, 3G-H: the barrier 26, 36 and source 29, 39, gate 27, 37 and drain 24, 34 upper contacts are defined and deposited. In addition, a passivation layer 26a, 36a is deposited, which entirely covers the barrier 26, 36 (though not depicted in FIGS. 2H, 3H).

Some of the methods described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly mentioned may be contemplated, as the skilled person will appreciate.

What is claimed is:

1. A non-polar, III-Nitride semiconductor fin field-effect transistor (finFET), comprising:
   a Si(110) silicon substrate, exhibiting a support surface parallel to a Si(110) plane of the silicon substrate; and
   a fin, comprising a III-Nitride crystalline layer grown along its c-direction, so as to have sidewalls that are parallel to m and a planes of the III-Nitride crystalline layer, wherein the c-direction is parallel to a Si<111> direction of the silicon substrate, such that two opposite ones of said sidewalls are parallel to the support surface of the silicon substrate.

2. The non-polar, III-Nitride finFET according to claim 1, wherein the silicon substrate has a step profile, including a lower step and an upper step, wherein said support surface is a tread of the lower step, which is separated from the upper step by a riser that is parallel to a Si(111) plane of the silicon substrate, and wherein said III-Nitride crystalline layer is in contact with and extends from the riser.

3. The non-polar, III-Nitride finFET according to claim 2, further comprising a dielectric layer between the III-Nitride crystalline layer and the tread.

4. The non-polar, III-Nitride finFET according to claim 3, wherein said dielectric layer comprises $SiO_2$.

5. The non-polar, III-Nitride finFET according to claim 3, wherein the finFET further comprises a template material, the latter including said dielectric layer, the template material defining, at least partly, an aperture to the riser of the silicon substrate, and wherein the III-Nitride crystalline layer extends from the riser, through the aperture.

6. The non-polar, III-Nitride finFET according to claim 5, wherein said dielectric layer is a first dielectric layer and the template material comprises a second dielectric layer, extending at least partly parallel to the first dielectric layer, the III-Nitride crystalline layer being sandwiched between the first and the second dielectric layers, and wherein said aperture is defined, at least partly, by the first dielectric layer and the second dielectric layer.

7. The non-polar, III-Nitride finFET according to claim 6, wherein the dielectric layers have, each, a step profile, so as for them to successively extend parallel to said tread, thereby defining said aperture, then parallel to said riser and then parallel again to the tread.

8. The non-polar, III-Nitride finFET according to claim 1, wherein said III-Nitride crystalline layer comprises GaN.

9. The non-polar, III-Nitride finFET according to claim 1, further comprising:
a barrier material partly wrapping the III-Nitride crystalline layer; and
a gate, partly wrapping the barrier material;
wherein the barrier material has:
a wider bandgap than a bandgap of the III-Nitride crystalline layer; and
a conduction band offset with respect to a conduction band of the III-Nitride crystalline layer.

10. The non-polar, III-Nitride finFET according to claim 9, wherein said barrier material comprises at least one of an oxide and $Al_xIn_yGa_{1-x-y}N$.

11. The non-polar, III-Nitride finFET according to claim 9, further comprising a source contact and a drain contact, each partly wrapping the III-Nitride crystalline layer on each side of the gate.

12. The non-polar, III-Nitride finFET according to claim 11, wherein each of the source contact and the drain contact has a bilayer structure, wherein an inner layer of the bilayer structure comprises a doped III-Nitride material.

13. The non-polar, III-Nitride finFET according to claim 12, wherein:
the III-Nitride crystalline layer comprises GaN; and
the doped III-Nitride material of the inner layer of the bilayer structure of each of the source contact and the drain contact comprises doped GaN.

14. The non-polar, III-Nitride finFET according to claim 9, further comprising a passivation layer covering, entirely, said barrier material.

15. An integrated circuit, comprising at least one non-polar, III-Nitride fin field-effect transistor (finFET), said at least one finFET comprising:
a Si(110) silicon substrate, exhibiting a support surface parallel to a Si(110) plane of the silicon substrate; and
a fin, comprising a III-Nitride crystalline layer grown along its c-direction, so as to have sidewalls that are parallel to m and a planes of the III-Nitride crystalline layer, wherein the c-direction is parallel to a Si<111> direction of the silicon substrate, such that two opposite ones of said sidewalls are parallel to the support surface of the silicon substrate.

16. A method of fabricating a non-polar, III-Nitride semiconductor fin field-effect transistor (finFET), the method comprising:
providing a Si(110) silicon substrate, the silicon substrate exhibiting a support surface parallel to a Si(110) plane of the silicon substrate; and
growing a III-Nitride crystalline layer along its c-direction, so as for it to have sidewalls that are parallel to m and a planes of the III-Nitride crystalline layer, wherein the c-direction is parallel to a Si<111> direction of the silicon substrate, such that two opposite ones of said sidewalls are parallel to the support surface of the silicon substrate, to obtain a fin for the finFET.

17. The method according to claim 16, wherein:
the silicon substrate has a step profile, including a lower step and an upper step, wherein said support surface is a tread of the lower step, which is separated from the upper step by a riser that is parallel to a Si(111) plane of the silicon substrate; and
said III-Nitride crystalline layer is grown so as to be in contact with and extend from the riser.

18. The method according to claim 17, wherein:
the silicon substrate is provided with a dielectric layer; and
the III-Nitride crystalline layer is grown above the dielectric layer, so as for the dielectric layer to be arranged between the III-Nitride crystalline layer and the tread.

19. The method according to claim 18, wherein said silicon substrate is provided with a template material, the latter including said dielectric layer, wherein the template material defines, at least partly, an aperture to the riser of the silicon substrate, and wherein the III-Nitride crystalline layer is subsequently grown so as to extend from the riser, through the aperture.

20. The method according to claim 19, further comprising, prior to providing the silicon substrate with the template material, obtaining said template material on the silicon substrate.

21. The method according to claim 19, wherein:
said dielectric layer is a first dielectric layer;
the template material provided comprises a second dielectric layer, extending at least partly parallel to the first dielectric layer; and
the III-Nitride crystalline layer is grown between the first and the second dielectric layers.

22. The method according to claim 16, further comprising:
depositing a barrier material so as for it to partly wrap the grown III-Nitride crystalline layer; and
depositing and patterning a gate, the latter partly wrapping the barrier material;
wherein the barrier material has:
a wider bandgap than a bandgap of the III-Nitride crystalline layer grown; and
a conduction band offset with respect to a conduction band of the III-Nitride crystalline layer.

23. The method according to claim 22, wherein:
the III-Nitride crystalline layer grown comprises GaN; and
the barrier material deposited comprises a material selected from the group consisting of $Al_xIn_yGa_{1-x-y}N$ and an oxide.

24. The method according to claim 22, further comprising depositing and patterning a source contact and a drain contact, so as for each of the source contact and the drain contact to partly wrap the III-Nitride crystalline layer on each side of the gate patterned.

25. The method according to claim 24, wherein each of the source contact and the drain contact are deposited as a bilayer structure, wherein an inner layer of the bilayer structure comprises a doped III-Nitride material.

* * * * *